(12) United States Patent
Eriksen et al.

(10) Patent No.: US 7,400,042 B2
(45) Date of Patent: Jul. 15, 2008

(54) SUBSTRATE WITH ADHESIVE BONDING METALLIZATION WITH DIFFUSION BARRIER

(75) Inventors: Odd Harald Steen Eriksen, Brooklyn Park, MN (US); Kimiko Jane Childress, Farmington, MN (US)

(73) Assignee: Rosemount Aerospace Inc., Burnsville, MN (US)

( * ) Notice: Subject to any disclaimer, the term of this patent is extended or adjusted under 35 U.S.C. 154(b) by 318 days.

(21) Appl. No.: 11/120,885

(22) Filed: May 3, 2005

(65) Prior Publication Data

US 2006/0249847 A1    Nov. 9, 2006

(51) Int. Cl.
*H01L 29/43* (2006.01)
*H01L 21/44* (2006.01)

(52) U.S. Cl. .................. 257/757; 257/761; 257/769; 257/E23.157; 438/655; 438/683; 438/686

(58) Field of Classification Search .................. 257/757
See application file for complete search history.

(56) References Cited

U.S. PATENT DOCUMENTS

| | | | |
|---|---|---|---|
| 3,200,490 | A | 8/1965 | Clymer |
| 3,396,454 | A | 8/1968 | Murdock et al. |
| 3,619,742 | A | 11/1971 | Rud, Jr. |
| 3,879,746 | A | 4/1975 | Fournier |
| 3,935,986 | A | 2/1976 | Lattari et al. |
| 4,215,156 | A | 7/1980 | Dalal et al. |
| 4,233,337 | A | 11/1980 | Friedman et al. |
| 4,330,343 | A | 5/1982 | Christou et al. |
| 4,400,869 | A | 8/1983 | Wilner et al. |
| 4,505,027 | A | 3/1985 | Schwabe et al. |
| 4,545,115 | A | 10/1985 | Bauer et al. |
| 4,637,129 | A | 1/1987 | Derkits, Jr. et al. |
| 4,702,941 | A | 10/1987 | Mitchell et al. |
| 4,722,227 | A | 2/1988 | Grob et al. |
| 4,758,534 | A | 7/1988 | Derkits, Jr. et al. |

(Continued)

FOREIGN PATENT DOCUMENTS

DE    10060439    6/2002

(Continued)

OTHER PUBLICATIONS

Okojie et al., "Stable Ti/TaSi$_2$/Pt Ohmic Contacts on N-Type 6H-SiC Epilayer at 600° C. in Air," Materials Research Society Symposium Proceedings, vol. 622, (2000).

(Continued)

*Primary Examiner*—Stephen W Smoot
(74) *Attorney, Agent, or Firm*—Thompson Hine LLP

(57) ABSTRACT

A metallization layer that includes a tantalum layer located on the component, a tantalum silicide layer located on the tantalum layer, and a platinum silicide layer located on the tantalum silicide layer. In another embodiment the invention is a component having a metallization layer on the component. In another embodiment, the metallization layer has a post-annealing adhesive strength to silicon of at least about 100 MPa as measured by a mechanical shear test after exposure to a temperature of about 600° C. for about 30 minutes, and the metallization layer remains structurally intact after exposure to a temperature of about 600° C. for about 1000 hours. The metallization is useful for bonding with brazing alloys.

48 Claims, 13 Drawing Sheets

U.S. PATENT DOCUMENTS

| | | | |
|---|---|---|---|
| 4,777,826 A | 10/1988 | Rud, Jr. et al. | |
| 4,910,578 A * | 3/1990 | Okamoto | 257/757 |
| 4,912,543 A | 3/1990 | Neppl et al. | |
| 4,939,497 A | 7/1990 | Nishida et al. | |
| 4,960,718 A | 10/1990 | Aina | |
| 5,038,996 A | 8/1991 | Wilcox et al. | |
| 5,182,218 A | 1/1993 | Fujihira | |
| 5,200,349 A | 4/1993 | Yokoyama | |
| 5,285,097 A | 2/1994 | Hirai | |
| 5,286,671 A | 2/1994 | Kurtz et al. | |
| 5,346,855 A | 9/1994 | Byrne et al. | |
| 5,369,300 A * | 11/1994 | Heideman et al. | 257/651 |
| 5,374,564 A | 12/1994 | Bruel | |
| 5,436,491 A | 7/1995 | Hase et al. | |
| 5,457,345 A | 10/1995 | Cook et al. | |
| 5,536,967 A | 7/1996 | Yokoyama | |
| 5,559,817 A | 9/1996 | Derkits, Jr. et al. | |
| 5,637,905 A | 6/1997 | Carr et al. | |
| 5,641,994 A | 6/1997 | Bollinger et al. | |
| 5,670,823 A | 9/1997 | Kruger et al. | |
| 5,675,159 A | 10/1997 | Oku et al. | |
| 5,802,091 A | 9/1998 | Chakrabarti et al. | |
| 5,882,532 A | 3/1999 | Field et al. | |
| 5,882,738 A | 3/1999 | Blish, II et al. | |
| 5,935,430 A | 8/1999 | Craig | |
| 5,955,771 A | 9/1999 | Kurtz et al. | |
| 6,027,957 A | 2/2000 | Merritt et al. | |
| 6,050,145 A | 4/2000 | Olson et al. | |
| 6,058,782 A | 5/2000 | Kurtz et al. | |
| 6,122,974 A | 9/2000 | Sato et al. | |
| 6,191,007 B1 | 2/2001 | Matsui et al. | |
| 6,234,378 B1 | 5/2001 | Ford et al. | |
| 6,272,928 B1 | 8/2001 | Kurtz | |
| 6,320,265 B1 | 11/2001 | Chakrabarti et al. | |
| 6,363,792 B1 | 4/2002 | Kurtz et al. | |
| 6,447,923 B1 * | 9/2002 | Yamakawa | 428/450 |
| 6,452,427 B1 | 9/2002 | Ko et al. | |
| 6,465,271 B1 | 10/2002 | Ko et al. | |
| 6,530,282 B1 | 3/2003 | Kurtz et al. | |
| 6,564,644 B1 | 5/2003 | Kurtz | |
| 6,566,158 B2 | 5/2003 | Eriksen et al. | |
| 6,586,330 B1 | 7/2003 | Ludviksson et al. | |
| 6,595,066 B1 | 7/2003 | Kurtz et al. | |
| 6,612,178 B1 | 9/2003 | Kurtz et al. | |
| 6,706,549 B1 | 3/2004 | Okojie | |
| 6,773,951 B2 | 8/2004 | Eriksen et al. | |
| 6,845,664 B1 | 1/2005 | Okojie | |
| 6,928,878 B1 | 8/2005 | Eriksen et al. | |
| 6,932,951 B1 | 8/2005 | Losey et al. | |
| 6,956,268 B2 | 10/2005 | Faris | |
| 2003/0108674 A1 | 6/2003 | Chung et al. | |
| 2003/0201530 A1 * | 10/2003 | Kurihara et al. | 257/712 |
| 2005/0042865 A1 | 2/2005 | Cabral et al. | |
| 2006/0032582 A1 | 2/2006 | Chen et al. | |

FOREIGN PATENT DOCUMENTS

| | | |
|---|---|---|
| EP | 0119691 | 9/1984 |
| EP | 0552466 | 7/1993 |
| EP | 0585084 | 3/1994 |
| GB | 2221570 | 2/1990 |

OTHER PUBLICATIONS

Lee, "Thermodynamic considerations of thermal oxidation of metal silicides," Thin Solid Films, 216, pp. 230-234 (1992).

Liu et al., "Annealing effects of tantalum films on Si and $SiO_2$/Si substrates in various vacuums," Journal of Applied Physics, vol. 90, No. 1, pp. 416-420 (Jul. 1, 2001).

Doppalapudi et al., "SiC-Microhotplate Conductometric Sensor Array for NOx, CO, and Hydrocarbon Monitoring of Hot Engine Emissions," U.S. Environmental Protection Agency, National Center For Environmental Research, (2002/2003).

Sinha, A.K. et al., "Effect of alloying behavior on the electrical characteristics of n-GaAs Schottky diodes metallized with W, Au, and Pt," Appl. Phys. Lett., vol. 23, No. 12, pp. 666-668 (1973).

Guivarc'h, A. et al., "Growth of RhGa on GaAs (001) in a molecular beam epitaxy system," Appl. Phys. Lett., 52 (12), pp. 948-950 (Mar. 21, 1988).

Sinha, A.K. et al., "n-GaAS Schottky Diodes Metallized with Ti and Pt/Ti," SSE, vol. 19, No. 6-E, pp. 489-492 (1976).

Kumar, J. et al., "Reaction of Sputtered Pt Films on GaAS," Phys. Chem. Solids, vol. 36, pp. 535-541 (1975).

Fukuda, M., Reliability and Degradation of Semiconductor Lasers and LEDs, Chapter 6, Artech House, pp. 185-205 (1991).

Zheng, X.Y. et al., "Solid State Phase Equilibria in the Pt-Ga-As System," Journal of Less-Common Metals, 146, pp. 233-239 (1989).

Lince, J.R. et al., "The growth of $AuGa_2$ thin films on GaAs (001) to form chemically unreactive interfaces," J. Mater. Res, 1 (4), pp. 537-542 (Jul./Aug. 1986).

Neppl, F. et al., "A $TaSi_x$ Barrier for Low Resistivity and High Reliability of Contacts to Shallow Diffusion Regions in Silicon," Thin Solid Films, 120, pp. 257-266 (1984).

DeBlasi, J.M. et al., Characteristics of $TaSi_2$/Poly-Si Films Oxidized in Steam for VLSI Applications, J. Electrochem. Soc.: Solid-State Science and Technology, pp. 2478-2482 (Dec. 1983).

Das, S.R., et al., "Thickness dependence of the properties and thermal stability of PtSi films," Thin Solid Films, 253, pp. 467-472 (1994).

Holloway, K. et al., "Tantalum as a diffusion barrier between copper and silicon: Failure mechanism and effect of nitrogen addition," J. Appl. Phys., 71 (11), pp. 5433-5444 (Jun. 1992).

Crider, C.A. et al., "Platinum silicide formation under ultrahigh vacuum and controlled impurity ambients," J. Appl. Phys. 52 (4), pp. 2860-2868 (Apr. 1981).

Saraswat, K.C. et al., Thermal oxidation of tantalum silicide in $O_2$ and $H_2O$, Appl. Phys. Lett., 41 (12), pp. 1127-1129 (Dec. 1982).

Lee, H.G., "Thermodynamic considerations of thermal oxidation of metal silicides," Thin Solid Films, 216, pp. 230-234 (1992).

Bernstein et al., "Applications of Solid-Liquid Interdiffusion (SLID) Bonding in Integrated-Circuit Fabrication," Transactions of the Metallurgical Society of AIME, vol. 236, pp. 405-412 (Mar. 1966).

Newport Newsletter entitled "Solutions For Dispense, Assembly, and Soldering, The Newsletter of MRSI Group," vol. III, No. 1 (Jan. 2000).

Klumpp et al., "Vertical System Integration by Using Inter-Chip Vias and Solid-Liquid Interdiffusion Bonding," Japanese Journal of Applied Physics, vol. 43, No. 7A, pp. L829-L830 (Jun. 11, 2004).

Garrou, "Future ICs Go Vertical," Reed Electronics, (Feb. 1, 2005).

IZM Institut article entitled "Selected Results from Si-Technologie and Vertikale System Intefraction: Vertical System Integration," (Mar. 14, 2005).

Takeyama, M. et al., "Properties of $TaN_x$ films as diffusion barriers in the thermally stable Cu/Si contact systems," J. Vac. Sci. Techol. B 14(2), pp. 674-678 (Mar./Apr. 1996).

Reid, J.S. et al., "Amorphous (Mo, Ta, or W)-Si-N diffusion barriers for Al metallizations," J. Appl. Phys. 79 (2), pp. 1109-1115 (Jan. 1996).

Kaloyeros, A.E. et al., "Ultrathin Diffusion Barriers/Liners for Gigascale Copper Metallization," Annu. Rev. Mater. Sci 30, pp. 363-385 (2000).

Chason, E. et al., "Applied Physics Reviews—Ion beams in silicon processing and characterization," J. Appl. Phys. 81 (10), pp. 6513-6561 (May 1997).

McCluskey, P. et al., "Pushing the Limit: The Rise of High Temperature Electronics," Advanced Packaging, vol. 4, No. 1 (Jan./Feb. 1997), pp. 36-39.

Mantese, J.V. et al., "Platinum Wire Wedge Bonding: A New IC and Microsensor Interconnect," Journal of Electronic Materials, vol. 17, No. 4, pp. 285-289 (1988).

Guo, S. et al., "A monolithically integrated surface micromachined touch mode capacitive pressure sensor," Sensors and Actuators 80, pp. 224-232 (2000).

Kurtz, A.D. et al., "Ultra High Temperature, Miniature, SOI Sensors for Extreme Environments," by Kulite Semiconductor Products, Inc., Presented at the IMAPS International HiTEC 2004 Conference (May 2004).

Kühnel, W. et al., "Silicon Subminiature Microphones for Airborne Sound," Acustica, vol. 73, pp. 90-99 (1991).

Sheplak, M. et al., "A MEMS Microphone for Aeroacoustics Measurement" (1999).

IZM Institut paper entitled "The SLID-ICV technique introduced by FHG: Face-to-Face Solid Technology," (Nov. 2004).

Internet web page of LAI International, Inc., "Advanced Laser and Waterjet Machining Services for Industry" (Nov. 3, 2003).

* cited by examiner

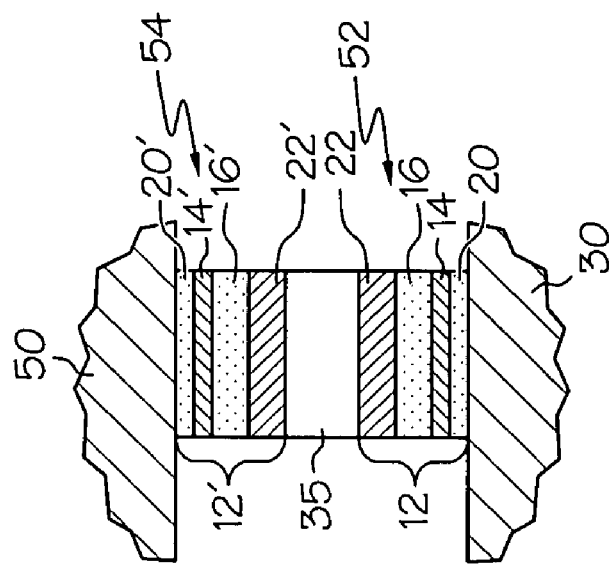
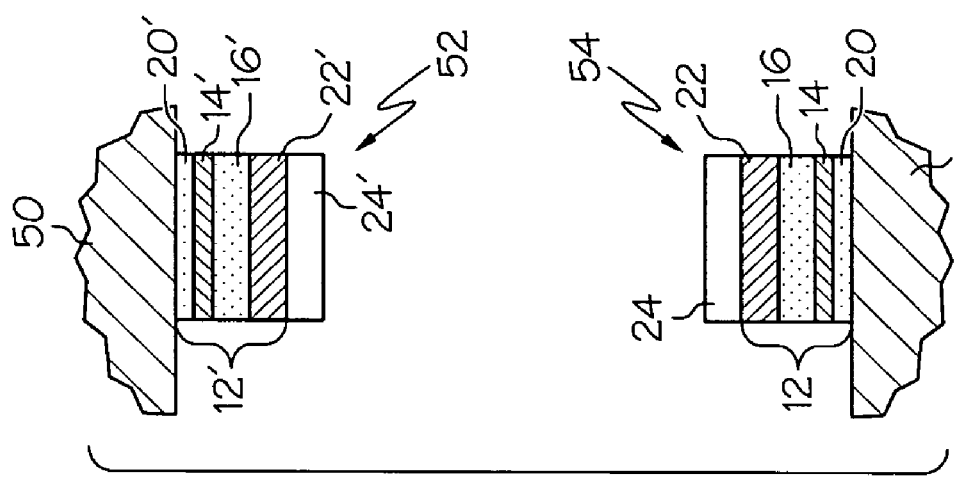

SUBSTRATE WITH ADHESIVE BONDING METALLIZATION WITH DIFFUSION BARRIER

The present invention is directed to structures utilizing metal films for bonding purposes, and more particularly, to structures utilizing metal films which adhere to the underlying substrate and provide a diffusion barrier.

BACKGROUND

When joined components are expected to be exposed to relatively high temperatures, the options for joining the components are limited. Joining methods such as welding, brazing, active metal brazing and mechanical fastening can be utilized to join components for service in high temperature environments. However, these joining techniques can be difficult to implement, may not be universally applicable to all substrates and materials, and can be prone to brittle fracture. Joining techniques can become further limited when it is desired to join disparate materials, such as ceramic to silicon.

In some cases a binary or eutectic alloy, such as a gold/nickel eutectic braze, can be utilized as a bonding layer to couple the components together. Depending upon the particular composition, binary or eutectic alloys are relatively heat resistant. However, the use of a binary or eutectic alloy requires metal films (also known as bonding films, metal coatings or metallization) on the associated component(s) to allow the binary or eutectic alloys to adhere to the associated component and to block diffusion of undesired materials therethrough. Accordingly, there is a need for metal films that can be used in binary or eutectic alloy joining procedures that can adhere well to the associated component, resist significant diffusion therethrough and be thermodynamically stable at elevated temperatures. There is also a need for metal films which are robust and which are electrically conductive so that the films can serve as an electrical contact layer.

SUMMARY

In one embodiment, the present invention provides a component including a bonding film or metallization. In various embodiments, this metallization adheres well to the underlying substrate at elevated temperatures, resists significant diffusion, and is thermodynamically stable at elevated temperatures.

In another embodiment, the invention provides a component suitable for bonding including a substrate and a metallization layer wherein:

the substrate is selected from the group consisting of semiconductors (e.g., silicon, silicon carbide or polysilicon), ceramics (e.g., aluminum nitride, sapphire or silicon nitride), glasses, nonmetallic materials, or combinations of these materials; and the metallization layer includes:

an adhesion layer selected from the group consisting of tantalum, chromium, zirconium, and hafnium and compounds thereof, e.g., compounds that are the reaction product of the substrate and one or more of the aforesaid metals;

a first diffusion blocking layer of a compound selected from the group consisting of tantalum silicide, tantalum carbide and tungsten nitride; and a second diffusion blocking layer of platinum.

In a more particular embodiment, the invention is a structure including a component and a metallization film on the component. The metallization film includes a tantalum layer located on the component, a tantalum silicide layer located on the tantalum layer, and a platinum silicide layer located on the tantalum silicide layer.

In another embodiment, the metallization film is characterized in that it has an adhesive strength to silicon, after annealing, of at least about 100 MPa after exposure to a temperature of about 600° C. for about 30 minutes, and the metallization film remains structurally intact after exposure to a temperature of about 600° C. for about 1000 hours.

Another embodiment of the invention is a bonding film or metallization comprising the adhesion and diffusion blocking layers described herein.

BRIEF DESCRIPTION OF THE DRAWINGS

FIG. 17 is a detail view of the area designated in FIG. 15;

FIG. 18 is a detail view of the area designated in FIG. 16; and

DETAILED DESCRIPTION

Figure 1:
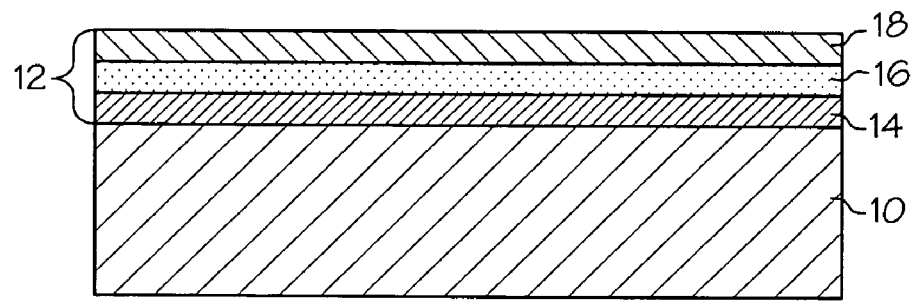
FIG. 1 is a side cross section of a component including a metal film located thereon.

FIG. 1 illustrates a surface, wafer, part or portion of a wafer, component, substrate microstructure or the like (together termed a substrate 10). The substrate 10 can include various components, microstructures, electrical circuitry, sensors, actuators, transducers, bond pads, etc. located thereon (not shown). The substrate 10 can be made of or include any of a wide variety of materials, including but not limited to semiconductor materials (such as silicon, polysilicon or silicon carbide), ceramics (such as aluminum nitride, sapphire or silicon nitride), glasses, nonmetallic materials, a combination of these materials or various other materials which can support microstructures or electronic components or otherwise provide structural support.

The substrate 10 includes a metal film or metallization layer 12 located thereon. It should be understood that when a layer or component is referred to as being located "on" or "above" another layer, component or substrate, (such as the metal film 12 located on the substrate 10) this layer or component may not necessarily be located directly on the other layer, component or substrate, and intervening layers, components, or materials could be present. Furthermore, when a layer or component is referred to as being located "on" or "above" another layer, component or substrate, that layer or component may either fully or partially cover the other layer, component or substrate.

In the embodiment shown in FIG. 1, the metallization layer 12 includes a first layer or adhesion layer 14, a second layer or outward diffusion blocking layer 16, and a third layer or inward diffusion blocking layer 18. The adhesion layer 14 can be made of any of a variety of materials which adhere well to the substrate 10. Thus, the material of the adhesion layer 14 can vary depending upon the material of the substrate 10, although the adhesion layer 14 is preferably selected based on its ability to bond strongly to the substrate 10.

Tantalum is one example of the adhesion material 14 because tantalum adheres well to a variety of materials. However, besides tantalum, various other materials such as chromium, zirconium, hafnium, or any element which reacts favorably with the substrate 10 to form compounds which bond strongly to the substrate may be utilized as the adhesion layer 14. In particular, in one embodiment, the adhesion layer 14 preferably has an adhesion strength to the substrate 10 of at least about 10 MPa, or more preferably at least about 50 MPa, or most preferably at least about 100 MPa as measured by a mechanical shear test. For example adhesion strength can be determined by a die shear strength test specified in Military Standard 883, Procedure 2019.5, or methods similar thereto.

In one embodiment, the adhesion layer 14 has a relatively high post-annealing adhesive strength to the substrate 10 at elevated temperatures, for example at temperatures above about 600° C. Thus, in one embodiment, the adhesion layer 14 has a post-annealing adhesion strength to silicon of at least about 10 MPa, or more preferably about 50 MPa, or most preferably at least about 100 MPa, at temperatures of about 600° C. as measured by a mechanical shear test.

The adhesion layer 14 has a variety of thicknesses, and can be deposited in a variety of manners. However, the adhesion layer 14 should have sufficient thickness to ensure proper adhesion to the substrate 10, but should not be so thick so as to add significant bulk to the metallization layer 12. The adhesion layer 14 preferably may be initially deposited to a thickness of between about 100 Angstroms and about 10,000 Angstroms, or more preferably about 200 Angstroms and about 1,000 Angstroms, and most preferably about 500 Angstroms (it should be understood that the thickness of the various layers shown in the drawings are not necessarily to scale). The adhesion layer 14 can be deposited by plasma enhanced physical vapor deposition (also known as plasma sputtering) or any other suitable deposition technique known in the art.

In the preferred embodiment, when the adhesion layer 14 is tantalum, the presence of oxygen at the interface of the adhesion layer 14 and a silicon substrate 10 can inhibit silicide formation which, as will be discussed below, is desired for its diffusion blocking properties. The presence of oxygen at the interface of the adhesion layer 14 and the substrate 10 can also cause adverse metallurgical transformations in the adhesion layer 14 to thereby create a highly stressed (i.e., weak) adhesion layer 14.

Accordingly, in one embodiment, prior to depositing the adhesion layer 14 on the substrate, the upper surface of the substrate 10 is cleaned to remove oxides. This cleaning step may involve the removal of oxides through plasma sputter etching or a liquid HF (hydrofluoric acid) solution. However, plasma sputter etching can cause excessive heating and surface roughening, and the HF wet etch process requires a water rinse which can cause re-oxidation of the substrate.

Therefore, a most preferred method to remove any oxides on the surface of the substrate 10 is to use a dry HF vapor cleaning process. The dry HF vapor cleaning does not require water rinsing and thereby provides a fully deoxidized substrate 10. The conditions for wet and dry HF etching/cleaning processes are well known in the art. The adhesion layer 14 should be deposited on the substrate 10 shortly after the cleaning step to ensure deposition thereon before oxides have the opportunity to redevelop on the substrate 10 (i.e. due to oxidizing chemical reactions with oxygen in the surrounding environment).

Outwardly diffusing materials, e.g., silicon of the substrate 10, may react with the materials of the metallization film 12 which can weaken the metallization layer 12. Thus, the second layer 16 is made of a material or materials which blocks the outward diffusion of the substrate material 10. Although the second 16 and third 18 layers are designated as inward and outward diffusion blocking layers, respectively, it should be understood that the second 16 and third 18 layers may not, by themselves, necessarily block diffusion in the desired manner. Instead, each of the layers 16, 18 may include or contribute a material which reacts to form a diffusion blocking layer upon sintering, annealing, chemical reactions, etc. of the film 12, as will be discussed in greater detail below.

The second layer 16 can be made of any of a wide variety of materials depending upon the materials of the substrate 10 (the outward diffusion of which is desired to be blocked). In one embodiment, the second layer 16 is tantalum silicide although a variety of other materials including but not limited to tantalum carbide and tungsten nitride may be utilized. The second layer 16 should have a thickness sufficient to prevent outward diffusion of the substrate material 10, or to contribute sufficient materials to form a sufficient outward diffusion barrier layer after annealing. The second layer 16 preferably is initially deposited to a thickness of between about 100 Angstroms and about 10,000 Angstroms, and more preferably between about 1,000 Angstroms and about 10,000 Angstroms, and most preferably, about 5,000 Angstroms. The second layer 16 is deposited by plasma sputtering, or any other suitable deposition technique known in the art.

When the second layer 16 is made of compounds (for example, tantalum silicide) the tantalum silicide may be deposited directly in its form as tantalum silicide. Alternately, layers of tantalum and layers of silicon may be deposited to subsequently react and form tantalum silicide. In this case alternating, thin (i.e. 5 to 20 Angstroms) discrete layers of the two basic materials (i.e., tantalum and silicon) are deposited on the adhesion layer 14 in a co-deposition process. The number of alternating layers is not critical provided that the total thickness of the composite layer is between about 100 and about 10,000 Angstroms as described above. After the alternating layers of tantalum and silicon are deposited, the alternating layers are exposed to elevated temperatures during an annealing step, which is discussed in greater detail below. During the subsequent annealing step (described below) the alternating layers of tantalum and silicon diffuse or react to form a single layer of tantalum silicide.

When using this method to deposit the tantalum silicide, the relative thickness of the deposited layers of tantalum and silicon during the co-deposition process controls the ratio of tantalum and silicon in the resultant tantalum silicide layer 16. Thus, the ability to control the relative thickness of the tantalum and silicon layers allows a silicon-rich or silicon-lean layer of tantalum silicide to be formed. For example, a relatively silicon-rich layer of tantalum silicide (i.e. tantalum silicide having an atomic composition of a few percentage points richer in silicon than stoichiometric tantalum silicide ($TaSi_2$)) may be preferred as the outward diffusion barrier 16 to enhance diffusion resistance.

The third layer 18 is made of a material or materials that may block or limit inward diffusion of undesired elements, compounds or gases. For example, the third layer 18 can be made of materials which block the inward diffusion of gases such as nitrogen, oxygen or carbon dioxide in the surrounding environment, or which block the outward diffusion of solid elements or compounds located on the metallization layer 12. These undesired elements, compounds or gases can adversely react with the other materials of the metallization layer 12 or the materials of substrate 10. In particular, inward diffusion of oxygen or nitrogen creates oxides or nitrides in the metallization layer 12 or in the substrate 10 which can weaken the metallization film 12 or its adhesion to the substrate 10, or otherwise adversely affect the properties of the metallization film 12 or substrate 10.

The third layer 18 may be made of a variety of materials, depending upon the materials of the substrate 10 and the materials of the adhesion 14 and second layer 16, as well as the elements, compounds or gases which are desired to be blocked from diffusing inwardly. However, platinum is a preferred material for the third layer 18. The third layer 18 is preferably deposited to an initial thickness of between about 100 Angstroms and about 10,000 Angstroms, or more preferably, between about 1,000 Angstroms and 5,000 Angstroms, and most preferably about 3,000 Angstroms. The third layer 18 is deposited by plasma sputtering or other suitable deposition methods known to those skilled in the art.

FIG. 1 illustrates the metallization layer 12 after deposition of the first layer 14 (tantalum in the illustrated embodiment), second layer 16 (tantalum silicide in the illustrated embodiment) and third layers 18 (platinum in the illustrated embodiment). After the deposition of the layers 14, 16 and 18, the metallization layer 12 is annealed (also termed sintering) to cause certain reactions and/or reaction byproducts. In particular, in one embodiment the structure shown in FIG. 1 is annealed for about 30 minutes at about 600° C. in a vacuum. Annealing at a temperature of about 600° C. provides good adhesion of the various layers of the metallization layer 12 to each other and to the substrate 10, and provides good electrical contact between the various layers of the metallization layer 12 to each other and to the substrate 10. Annealing at temperatures above about 600° C. can unfavorably alter the microstructure of the tantalum silicide 16 and may allow undesirable diffusion of the materials of the metallization layer 12 into the substrate 10.

Figure 2:
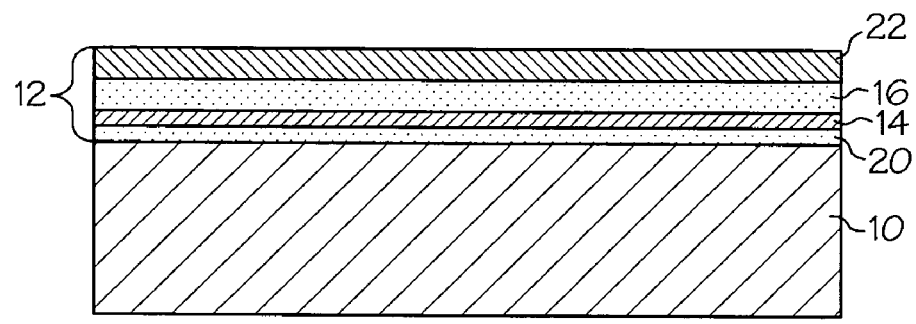
FIG. 2 is a side cross section of the component and metal film of FIG. 1, after annealing.

FIG. 2 illustrates the structure of FIG. 1 after the anneal step. It is noted that for discussion purposes the first 14, second 16 and third 18 layers may be referred to herein as the "tantalum layer 14," "tantalum silicide layer 16" and "platinum layer 18," respectively. However, this convention is included for ease of discussion purposes only and is not intended to convey that the layers are limited to those particular materials. Further, it is noted that various layers or materials other than those shown in FIG. 2 and discussed below may form in the metallization layer 12 after annealing, and FIG. 2 merely illustrates the presence of the various, major layers which are expected to form after annealing.

In particular, when the substrate 10 is silicon and the first 14, second 16 and third 18 layers are tantalum, tantalum silicide and platinum, respectively, after annealing an inner tantalum silicide layer 20 is formed as a reaction product of the adhesion layer 14 and the substrate 10. The inner tantalum silicide layer 20 adheres well to the tantalum adhesion layer 14 and to the substrate 10, and therefore provides a high adhesion strength for the metallization layer 12. In addition, because tantalum silicide generally blocks the outward diffusion of many materials (including silicon), the inner tantalum silicide layer 20 also acts as an outward diffusion-blocking layer for a silicon substrate 10.

When the substrate 10 is aluminum nitride (instead of silicon), the layer 20 may be or include materials other than tantalum silicide, such as tantalum nitride, tantalum aluminide or ternary compounds of tantalum, aluminum, and nitrogen. When the substrate 10 is made of materials other than silicon or aluminum nitride, and tantalum is used as the adhesion layer 14, various other diffusion-blocking tantalum compounds are formed depending upon the material of the substrate.

As shown in FIG. 2, after annealing the upper platinum layer 18 is converted to a platinum silicide layer 22 due to reactions between the platinum of layer 18 and the silicon of the tantalum silicide layer 16. The resultant platinum silicide 22 acts as an inward diffusion-blocking layer, and in particular blocks the inward diffusion of oxygen and nitrogen.

Figure 2A:
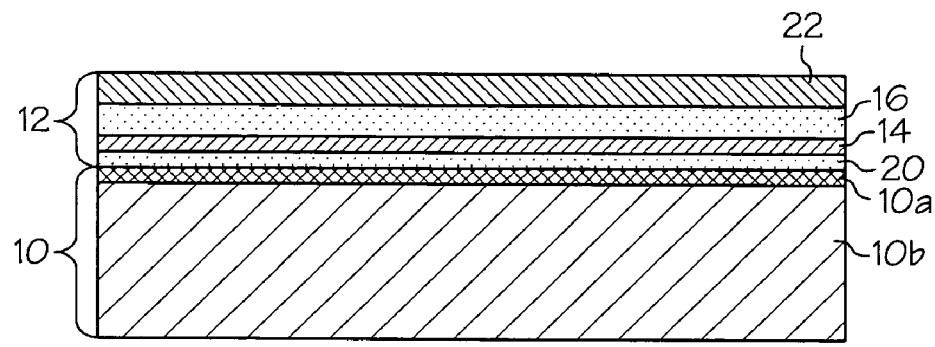
FIG. 2A is an alternative embodiment of the component of FIG. 2.

FIG. 2A illustrates an alternate embodiment wherein the substrate 10 includes a relatively thin (i.e. between about 0.2 and about 0.5 micron) layer of electrically insulating material 10a. The insulating material 10a may be aluminum nitride, SiN, $SiO_2$ $Al_2O_3$ or any other electrically insulating or dielectric material. The substrate 10 of FIG. 2A also includes a relatively thick (i.e. 1-50 micron) electrically conductive material 10b located below the insulating material 10a. The electrically conductive material 10b could be doped silicon or semiconductors. The electrically insulating material 10a is provided to electrically isolate the film 12 and any other component located on the substrate 10 from the electrically conductive material 10b.

When the substrate of FIG. 2A is utilized, the annealing step may create electrical leakage through the insulating layer 10a due to diffusion of platinum or tantalum into the insulating layer 10a and through to the conductive layer 10b. In order to reduce diffusion through the insulating layer 10a and ensure the proper phase formation of the tantalum silicide layer 16 (e.g. when the tantalum silicide layer 16 is initially deposited in separate layers of tantalum and silicide), rather than utilizing a single step anneal process, a two step anneal process may be utilized. The two step anneal process includes performing a first anneal step at about 460° C. for about 30 minutes, slowly increasing the temperature to about 600° C. over a period of about 15 minutes, and then holding the temperature at about 600° C. for about 1 hour.

The two step anneal process improves adhesion of the metallization layer 12 to the substrate 10 and in particular improves adhesion of the adhesion layer 14. In addition, because a significant portion of the two step anneal process occurs at a relatively low temperature (i.e., below 600° C.), diffusion of platinum or tantalum through the layer 10a and into the conductive layer 10b is reduced, thereby reducing electrical leakage issues. Thus, either the one-step or two-step anneal process outlined above (or various other annealing steps that accomplish the results outlined above) can be carried out on the metallization film 12 to provide the structures shown in FIGS. 2 and 2A.

Figure 3:
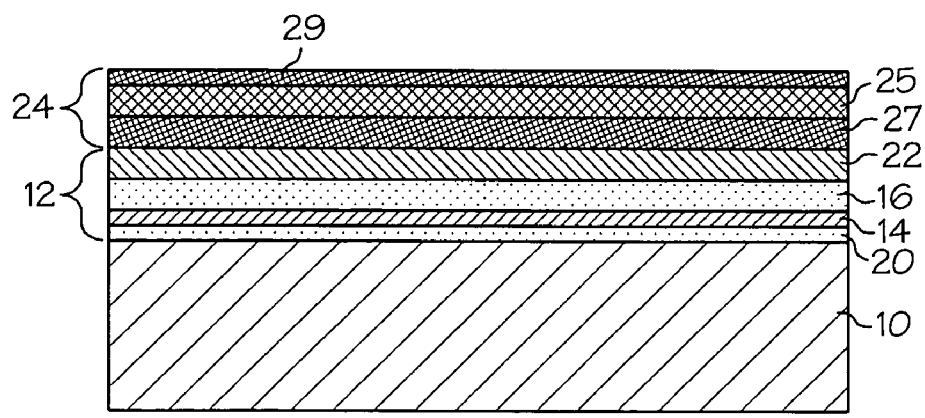
FIG. 3 is a side cross section of the component and metal film of FIG. 2, with a bonding layer located thereon.

FIG. 3 illustrates the structure of FIG. 2, with a bonding layer or bonding agent 24 located thereon. The purpose of this bonding layer 24 is to couple or attach the substrate 10 to another component or substrate 10' (see FIG. 4). The bonding layer 24 includes a material or materials which preferably can form a eutectic or binary alloy with another material under appropriate conditions. In the embodiment shown in FIG. 3, the bonding layer 24 includes first 25 and second 27 bonding materials or layers that can form eutectics with each other. For example, the first bonding material 25 is preferably germanium, tin or silicon, but can be any element or material that can form a eutectic alloy with the second bonding material 27. The second bonding material 27 is preferably gold, but can be any element or material that can form a eutectic alloy with the first bonding material 25.

Both the first 25 and second 27 bonding materials may be deposited on the metallization layer 12 by plasma sputtering or other suitable deposition techniques known to those skilled in the art. Further, the first 25 and second 27 bonding materials can be deposited in a variety of thicknesses. However, the thickness of the bonding materials 25, 27 should be selected to provide the desired ratio between the first 25 and second 27 bonding materials in the end product bond. In addition, the bonding layer 24 can include a variety of materials, compounds, compositions and the like, beyond those disclosed above for the first 25 and second 27 bonding materials. Representative examples of materials of the bonding layer 24 includes InCuAu, AuNi, TiCuNi, AgCu, AgCuZn, InCuAg, and AgCuSn.

In the illustrated embodiment the bonding layer 24 includes a capping layer 29 located on the first bonding material 25. The capping layer 29 caps and protects the first bonding material 25 to prevent oxidation of the first bonding material 25. The capping layer 29 can be any of a wide variety of materials which resist oxidation, such as gold. The capping layer 29 is preferably the same material as the second bonding layer 27 so that the capping layer 29 participates in the eutectic joining process. The capping layer 29 is quite thin, preferably having a thickness of about 1000 Angstroms or less.

Figure 4:
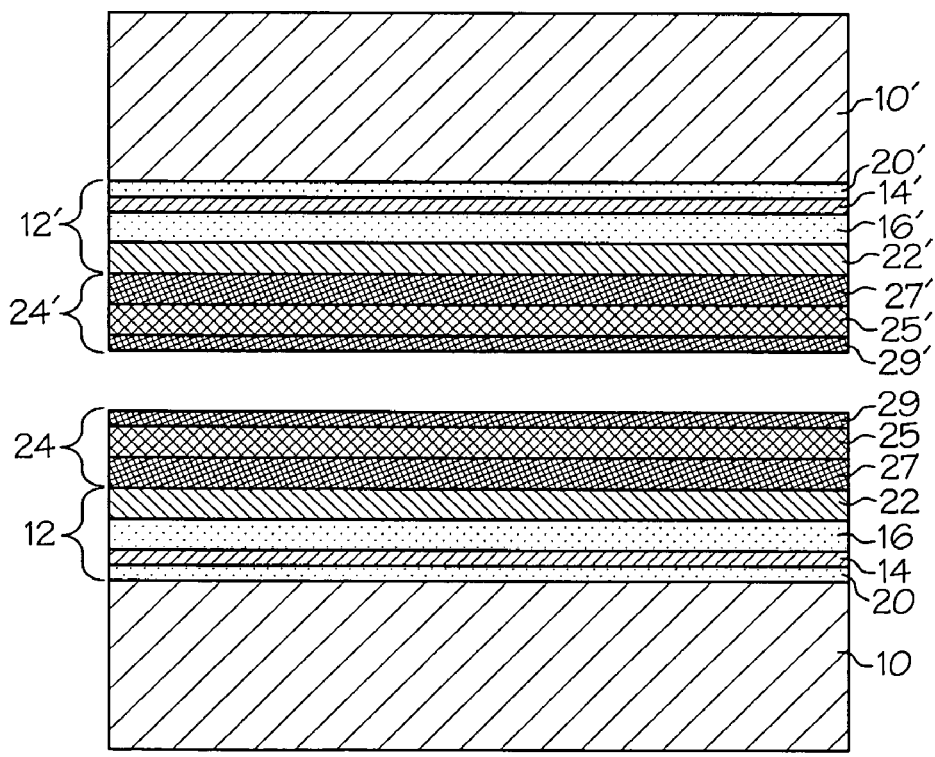
FIG. 4 is a side cross section of a pair of components positioned to be bonded together.

FIG. 4 illustrates the component or substrate of FIG. 3, with a second or auxiliary substrate or component 10' including a second metallization layer 12' and a second bonding layer 24' located thereon. The substrate 10' may be made of the same materials as the materials outlined above for the substrate 10, and the materials for the metallization layer 12' and bonding layer 24' of the substrate 10' correspond to the materials described above for the metallization layer 12 and bonding layer 24 of the substrate 10.

For the description below, it will be assumed that the first bonding materials 25, 25' are germanium, and that the second bonding materials 27, 27' and capping materials 29, 29' are gold to allow discussion of the specific properties of the gold/germanium eutectic alloy. However, this discussion is for illustrative purposes and it should be understood that various other materials may be utilized as the first bonding materials 25, 25', second bonding materials, 27, 27' and capping materials 29, 29'.

Figure 5:
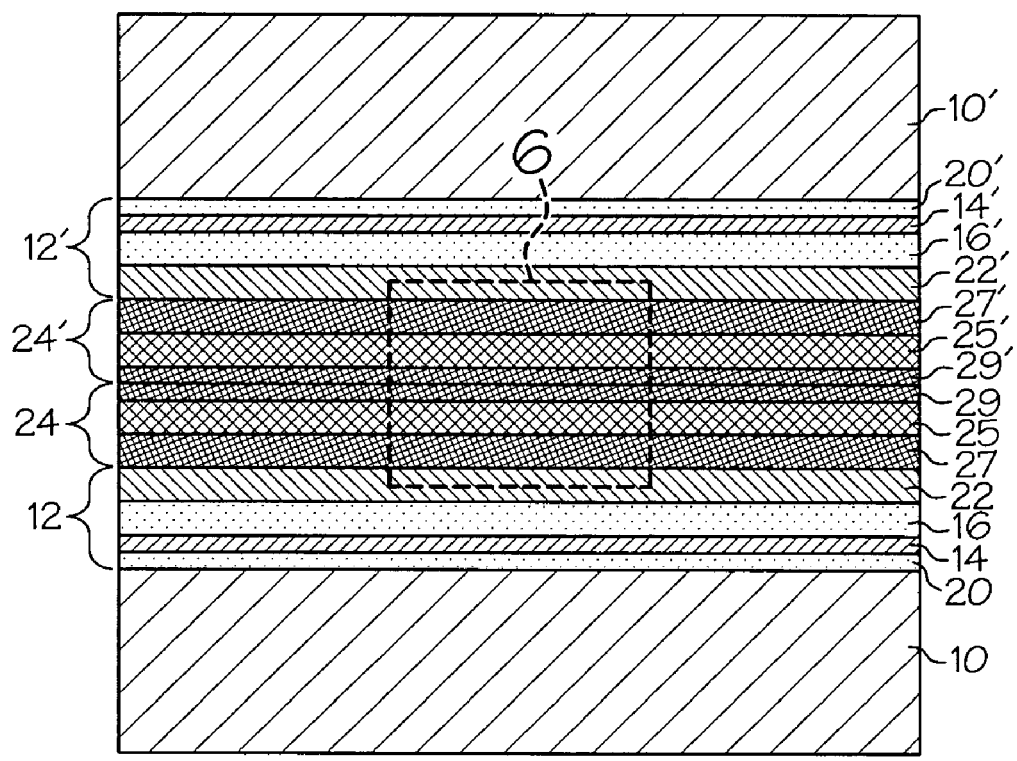
FIG. 5 is a side cross section of the components of FIG. 4 moved into contact with each other.
Figure 19:
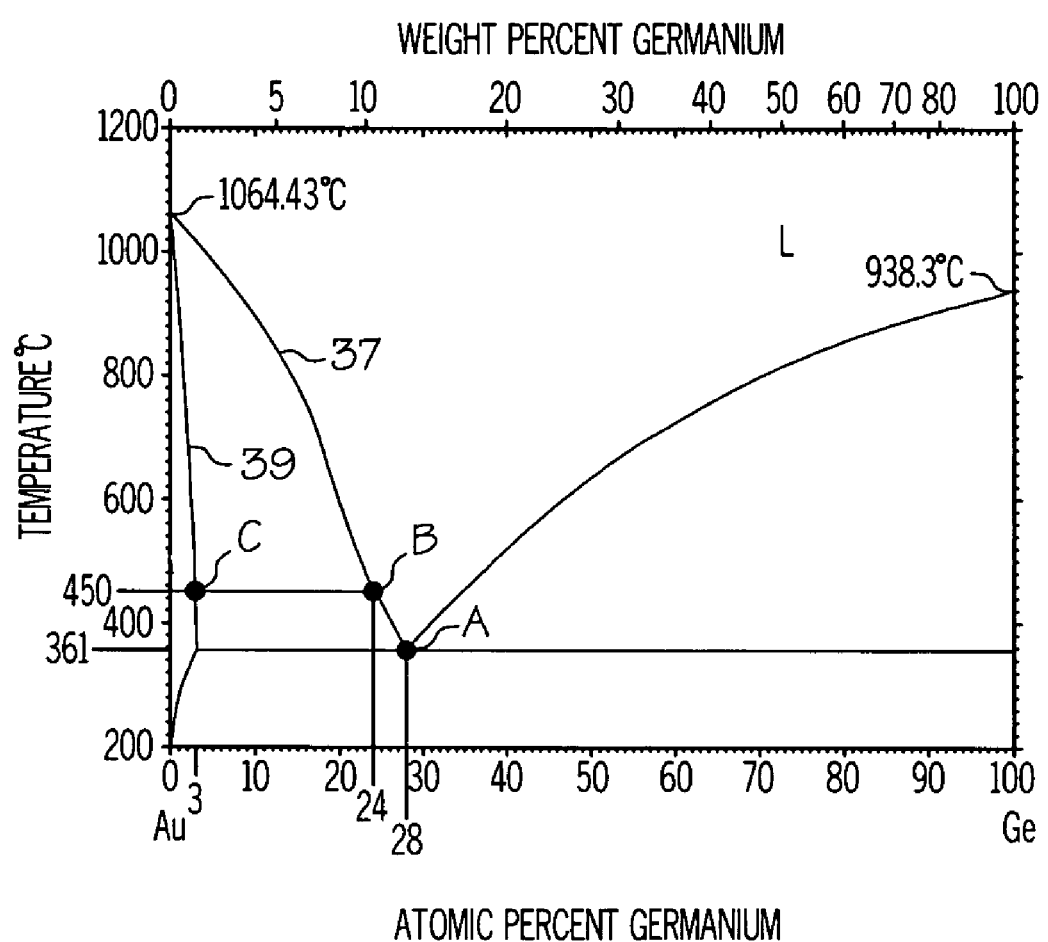
FIG. 19 is a eutectic diagram for germanium/gold alloys.

The substrates 10, 10' are next joined or bonded in a transient liquid phase bonding process which is well known in the art, but is outlined briefly below. To commence the transient liquid phase bonding a light pressure (e.g. a few pounds) is applied to press the substrates 10, 10' and bonding layers 24, 24' together (FIG. 5). The bonding layers 24, 24' are then exposed to a temperature at or above the eutectic point or eutectic temperature of the bonding alloy, i.e. a gold/germanium alloy. For example, as can be seen in FIG. 19, the eutectic temperature of a gold/germanium alloy is about 361° C.

In the illustrative example the bonding layers 24, 24' are exposed to a temperature of about 450° C. However, the actual bonding temperatures will depend upon the diffusion rate of the bonding materials 25, 25', 27, 27', the thickness of the bonding materials and the time available to complete the diffusion such that a uniform solid solution of the bonding alloy is achieved.

Figure 6:
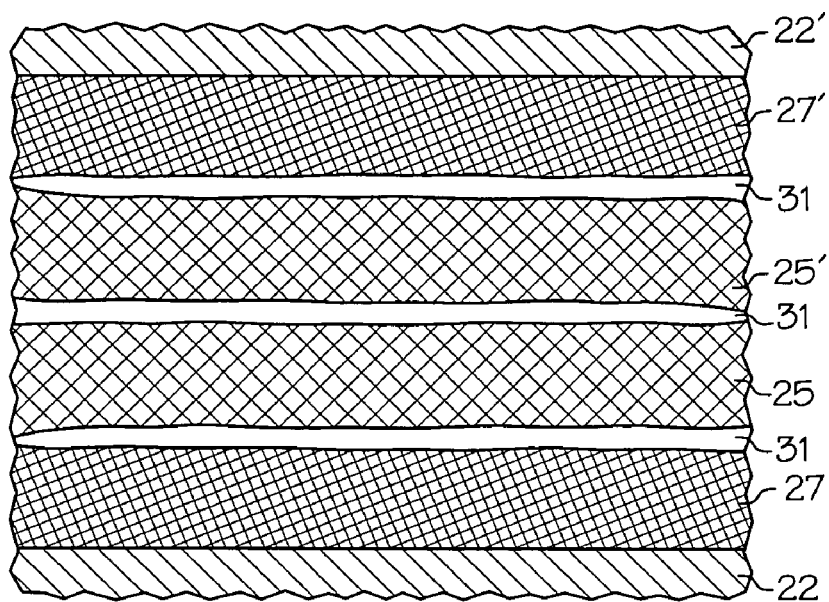
FIGS. 6-11 are a series of detail side cross sections of the components of FIG. 5, illustrating a bonding process.

Once the materials at the gold/germanium interfaces reach the eutectic temperature (i.e., 361° C.), zones of melted or liquid materials 31 are formed at each interface (see FIG. 6) due to the melting of materials. In FIG. 6, the entire capping layers 29, 29' have melted (due to the thinness of those layers) to form the central liquid zone 31, and portions of the first bonding layers 25, 25' have melted to form the top and bottom liquid zones 31. Each zone of liquid material 31 has a composition that is at or near the eutectic composition.

Figure 7:
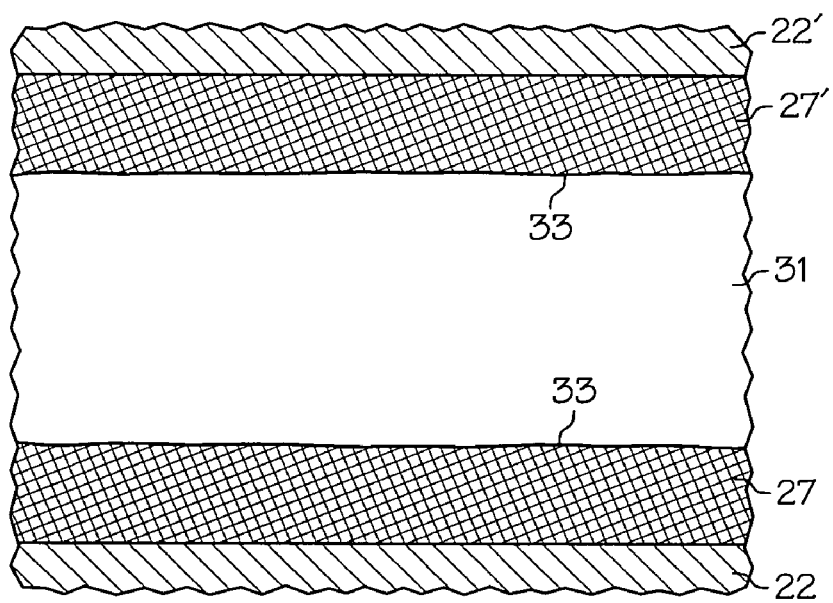

As the bonding layers 24, 24' continue to heat up and approach the ambient temperature (i.e., 450° in the illustrated example), the liquid zones 31 continue to grow and expand until all the material of the germanium layers 25, 25' melt and have been dissolved into the liquid zones 31. The separate liquid zones 31 of FIG. 6 grow and ultimately combine to form a single larger liquid zone 31 (FIG. 7). At the stage shown in FIG. 7, the last of the material of the germanium layers 25, 25' have been dissolved, and the liquid zone 31 remains at composition A of FIG. 19.

Next, the materials of the gold layers 27, 27' adjacent to the liquid zone 31 continue to liquefy as the surrounding materials approach the ambient temperature. As additional gold is melted and added to the liquid zone 31, the germanium in the liquid zone 31 is diluted and the percentage of germanium in the liquid zone 31 is thereby reduced. Thus, the composition of the liquid zone 31 moves up and to the left of point A along the liquidus line 37 of FIG. 19. As the melted gold continues to dilute the germanium, the liquid composition ultimately reaches the composition at point B of FIG. 19 when the liquid zone 31 reaches the ambient temperature of 450° C.

Figure 8:
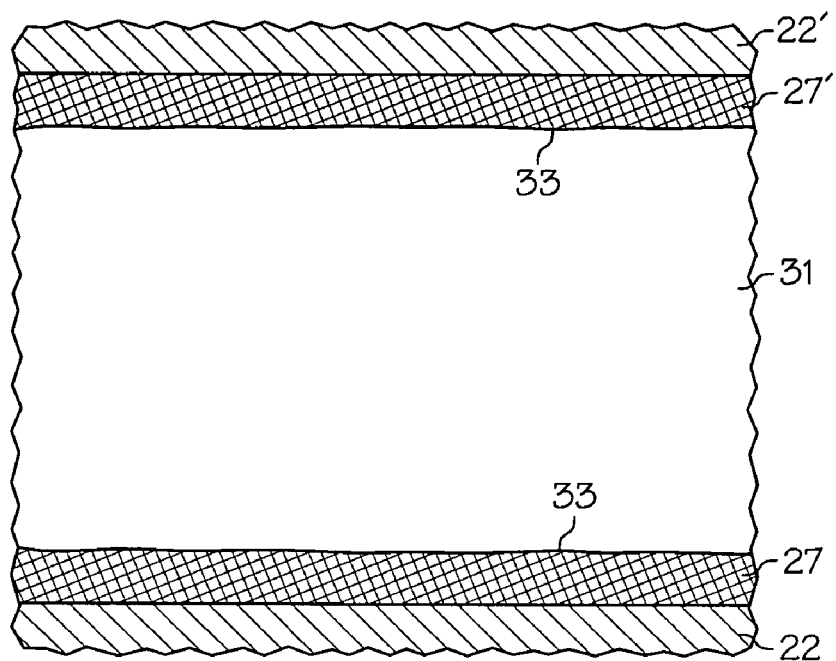

FIG. 8 illustrates the bonding process wherein the liquid zone 31 has grown and added gold such that the liquid zone 31 is at composition B. At this stage the liquid zone 31 has reached the ambient temperature of 450° C., and has a composition of about 24 atomic percent germanium and 76 atomic percent gold.

Figure 9:
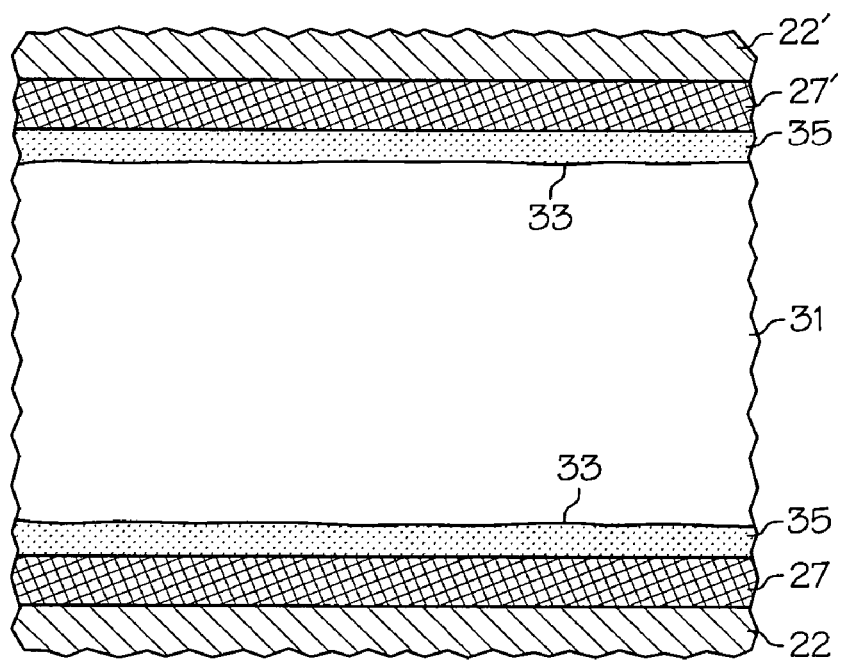

Once the composition of the liquid zone 31 reaches point B, the germanium in the liquid zone 31 begins diffusing into the remaining solid gold layer 27, 27' at the interface 33 of the liquid zone 31 and the gold layers 27, 27'. As this occurs, the concentration of germanium in the liquid zone 31 adjacent to the interface 33 drops. Once the percentage of germanium at the interface 33 drops sufficiently low (i.e., about 3 atomic percent germanium or less), the liquid zone 31 at the interface 33 forms into a solid solution phase 35 (see FIG. 9). The newly-formed solids 35 have a composition indicated at point C on the graph of FIG. 19. As can be seen in FIG. 19, the point C is located on the solidus line 39, which indicates the percentage of germanium at which solids will form for a given temperature. Thus the newly-formed solids 35 have about 3 atomic percent germanium and 97 atomic percent gold.

Figure 10:
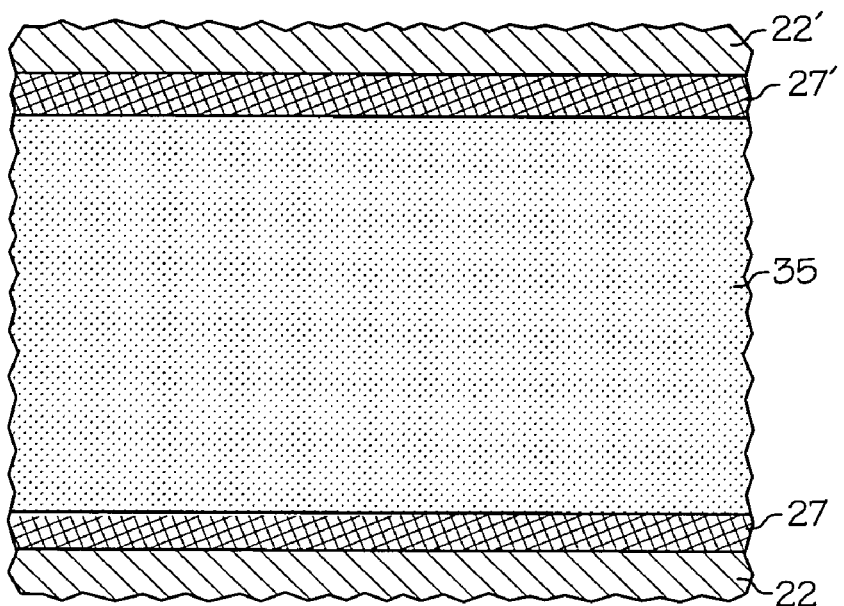
Figure 11:
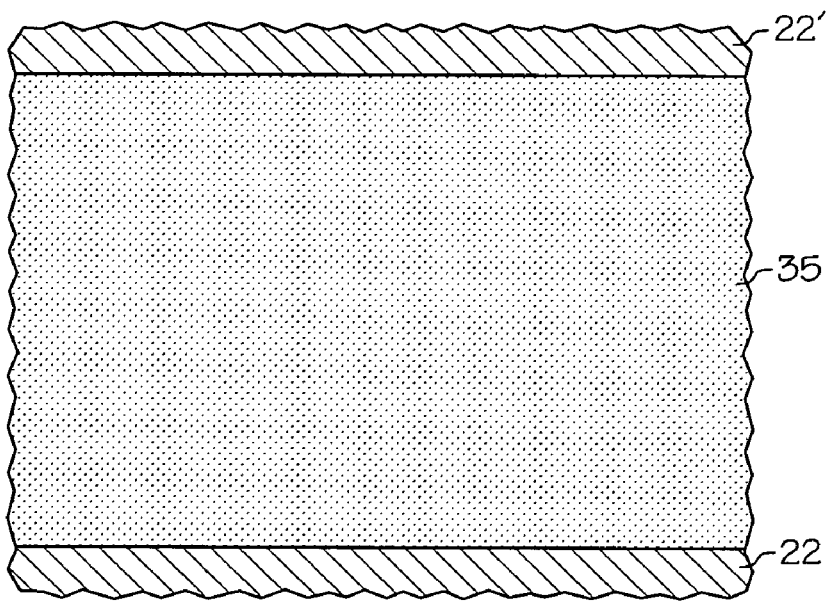

The ambient temperature continues to be held at 450° C. and remaining germanium in the liquid zone 31 continues to diffuse outwardly, through the newly-formed solids 35 and into the predominantly gold layers 27, 27'. As the germanium in the liquid zone 31 continues to diffuse outwardly, more germanium-poor liquids at the interface 33 of the liquid zone 31 and the solids 35 are created and ultimately form into solids 35. In this manner the solids 35 grow inwardly until the entire liquid zone 31 is consumed (FIG. 10). At this point the solid 35 may be relatively germanium-rich (i.e., 3 atomic percent germanium) and the surrounding gold layers 27, 27' may be relatively germanium-poor (i.e. less than 3 atomic percent germanium). In this case the germanium continues to diffuse, through solid-state diffusion, from the solid 35 into the gold layers 27, 27' until equilibrium is reached and both the solid 35 and the gold layers 27, 27' all have the same composition (shown as solid 35 in FIG. 11).

The solid 35 formed after solid state diffusion is a gold/germanium alloy or solid solution alloy having a composition of about 3 atomic percent germanium. However, the amount of available germanium may be restricted and/or scavenged (with a germanium scavenging material such as platinum, nickel and chromium) so that the resultant solid has a composition of less than 3 atomic percent germanium (e.g., as low as about 0.5 atomic percent germanium or even lower), which places the composition of the solid 35 to the left of point C of FIG. 19. With reference to the phase diagram of FIG. 19, reducing the atomic percentage of germanium to lower than 3 atomic percent provides a solution located on the solidus line 39 above and to the left of point C. Moving the composition to the left of point C provides a solid solution 35 with a melting point above 450° C., up to a theoretical maximum of 1064° C.

The transient liquid phase bonding method described above allows the joining of two materials at a relatively low temperature (but above the eutectic temperature) and results in a bond having a relatively high melting temperature. The resultant bonding material 35 is a hypoeutectic gold-germanium solid alloy having a relatively high melting temperature. The solid bonding material 35 can also be a hypoeutectic gold-silicon solid alloy or a hypoeutectic gold-tin solid alloy depending upon the starting materials for the bonding layers 24, 24'.

Figure 12:
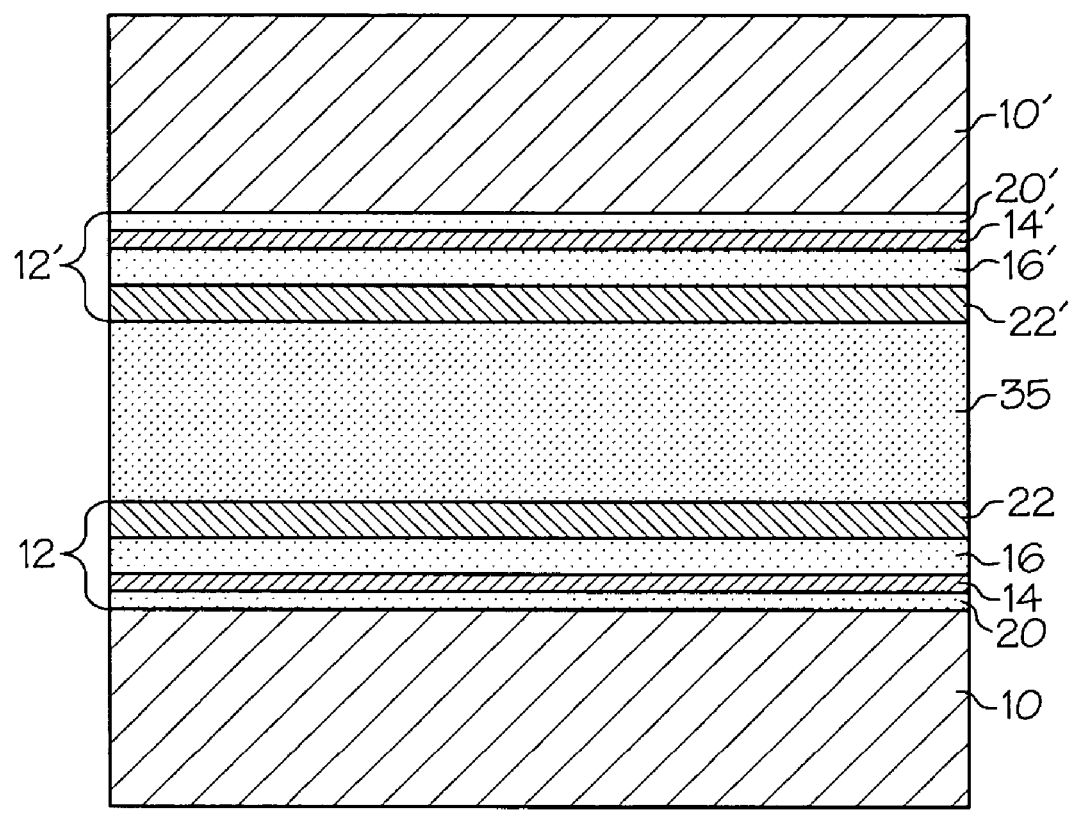
FIG. 12 is a side cross section of the components of FIG. 5 after bonding.

FIG. 12 illustrates the first 10 and second 10' components after the first 24 and second 24' bonding layers have been joined to form a single bonded layer 35. Thus, in the embodiment shown in FIG. 12, both of the substrates 10, 10' include metallization layers 12.

As described above the metallization film 12 includes the inward diffusion blocking layer 22 which blocks inward diffusion of materials. In particular, during the bonding process discussed above and shown in FIGS. 6-12, the elevated temperatures can cause diffusion of materials (i.e. materials of the bonding layer 24 and/or $O_2$ or $N_2$ from the surrounding atmosphere) into or through the metallization film 12 which would cause adverse reactions in the metallization layers 12, 12' and/or components 10, 10'. However, the inward diffusion blocking layer 22 blocks diffusion during the bonding process such that no appreciable new layers of material are formed in the metallization layers 12, 12' and components 10, 10' due to inwardly-diffusing materials.

For example, when the structure of FIG. 2 is placed in an environment containing a material whose diffusion is desired to be blocked (such as oxygen or nitrogen) for 50 hours at 600° C., no layers other than those layers shown in FIG. 2 are present, or if such layers are present they constitute less than about 1% by mass of the metallization layer 12 as measured by x-ray photoelectron spectroscopy ("XPS") analysis.

Similarly, layers 20 and/or 14 and/or 16 block outward diffusion of materials of the substrate 10 during bonding or exposure to elevated temperatures. In particular, when the structure of FIG. 2 is exposed to air, or to water vapor, or located in a vacuum at a temperature of 600° C. after 50 hours, no layers other than those layers 10, 20, 14, 16, 18, 22 shown in FIG. 2 are present, or if such layers are present they are less than 1% by mass of the layer 12 as measured by XPS analysis.

In addition, the metallization layer 12 remains stable at elevated temperatures, for example during the elevated temperature of the bonding process. The metallization layer 12 of FIG. 2 is preferably thermodynamically stable such that the metallization layer 12 remains structurally intact (i.e. remains adhered to the substrate 10) after exposure to air, or to water vapor, or located in a vacuum at a temperature of 600° C. for 1000 hours. Thus, the metallization layer 12 of the present invention resists diffusion therethrough, adheres well to various substrates, and is thermodynamically stable. Furthermore, the metallization layer 12 retains these properties, even at elevated temperatures for extended periods of time, such as temperatures up to 600° C. and thus can withstand bonding processes.

The metallization layer 12 can be used as a substrate for bonding a variety of components, substrates, or the like. In the example shown in FIGS. 4-12 both of the substrates 10, 10' include a metallization layer located thereon. In the embodiment shown in FIGS. 13 and 14, only one of the components to be joined includes a metallization layer 12 located thereon. For example, in the embodiment shown in FIG. 13, a generally disk-like component, wafer or substrate 30 (such as a ceramic wafer disk or support disk) includes a metallization layer 12 located on its circumferential outer surface 36. The cylindrical housing 40, to which the disk 30 is to be coupled, does not include any metallization layer.

In order to deposit the first 14, second 16 and third 18 layers onto the circumferential outer surface 36, a cylindrical magnetron sputter deposition system may be utilized. In such a sputter system, the disk 30 is placed on a rotating fixture inside the sputter chamber of the cylindrical magnetron. The cylindrical magnetron deposits the first layer 14, the second layer 16 and the third layer 18 onto the outer surface 36 of the disk 30 in a direction normal to the outer surface 36. In this manner the cylindrical magnetron provides a sputtering flux that is normal to the curved surface 36 (i.e. the direction of flow of the metal atoms is normal to the outer surface 36). After deposition of the first 14, second 16 and third 18 layers, the layers 14, 16, 18 may be annealed to provide the layers 14, 16, 20, 22 (FIG. 13) as also shown in FIG. 2 and described in the accompanying text above.

Figure 13:
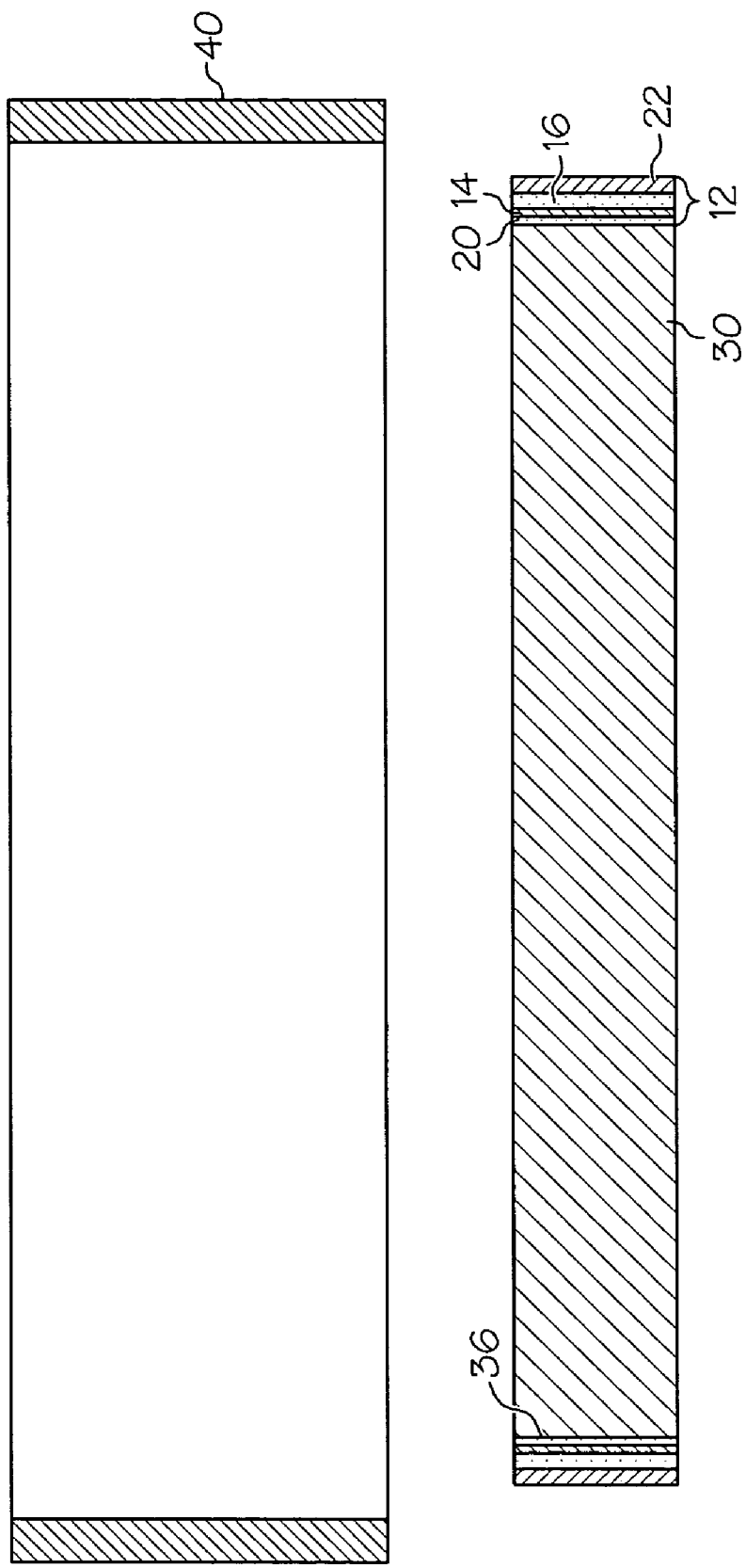
FIG. 13 is a side cross section of a wafer and housing.
Figure 14:
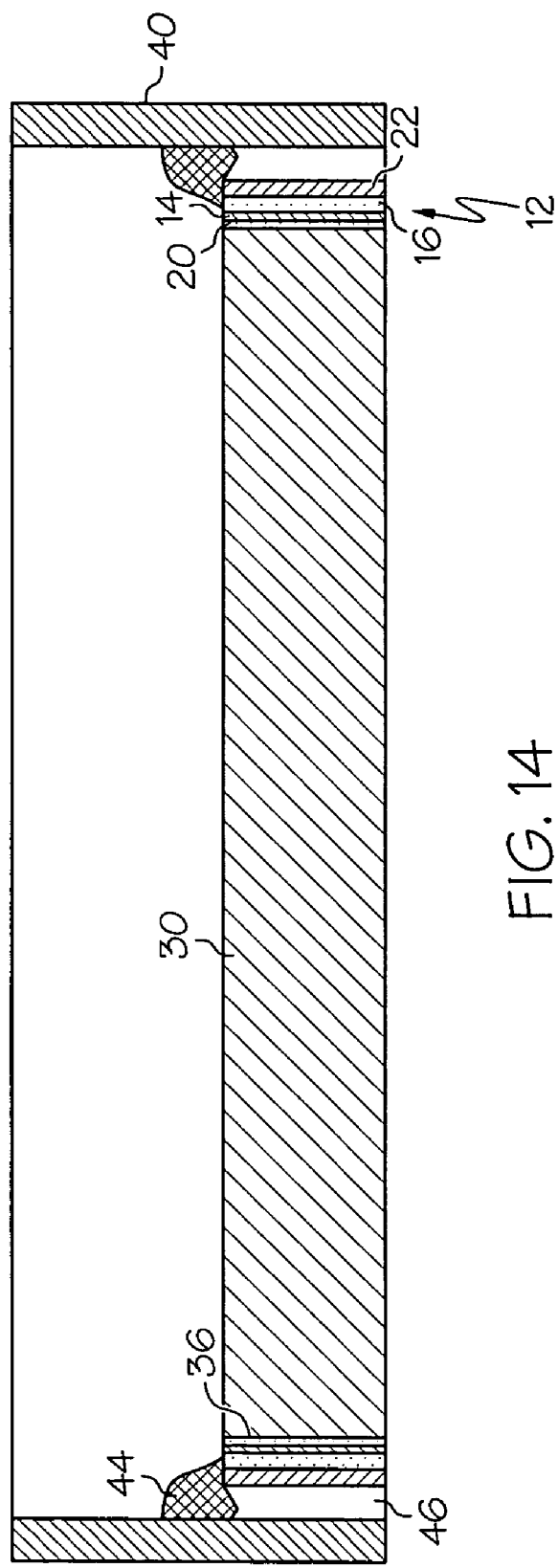
FIG. 14 is a side cross section of the wafer and housing of FIG. 14, in the process of being joined together.

FIG. 13 illustrates a generally tubular metal component or housing 40 shaped to be coupled to the cylindrical disk 30, and FIG. 14 illustrates the disk 30 fit into the metal housing 40. The metallization layer 12 allows the disk 30 to be easily coupled to the housing 40. In particular, as shown in FIG. 14 a ductile braze material 44, braze slurry, braze alloy or braze paste can be deposited near or around the outer circumference of the disk 30 and in intimate contact with the tubular housing 40 and the metallization layer 12 of the disk 30. Thus the braze material 44 is applied to the outer diameter of the disk 30 and/or the inner diameter of the housing 40.

The particular type of braze material, braze slurry, braze alloy or braze paste depends upon the type of materials of the disk 30 and the housing 40, but may take the form of a braze material pre-formed into the shape of a ring.

The braze material 44 may be deposited at room temperature and then exposed to an elevated temperature (i.e. a temperature of about 500° C.) suitable to melt the braze material 44. The melted braze material 44 (which acts as the bonding layer in the embodiment shown in FIGS. 13 and 14) is drawn into the gap 46 between the disk 30 and the housing 40 by capillary action (shown in FIG. 15). When the temperature is reduced the braze material 44 then cools and forms a strong bond in the well-known manner of standard brazing.

The disk 30 and housing 40 are sized to form a robust joint. In particular, upon heating (i.e. during the brazing process), the housing 40 expands to relatively loosely receive the disk 30 therein (shown in FIGS. 13 and 14). When the housing 40 is metal, the housing 40 has a relatively large coefficient of thermal expansion relative to ceramic materials such as the disk 30. After the heat source is removed, the metal housing 40 cools and contracts around the disk 30, thereby placing the disk 30 in compression. This cylindrical joint places the disk 30 in radial compression to thereby form a robust structure.

Because the metallization layer 12 adheres well to the disk 30, forms diffusion blocking layers, and is thermodynamically stable to high temperatures, the metallization layer 12 can be useful in forming brazed joints as described above. In this embodiment, the housing 40 does not require a metallization layer because the housing 40 is made of metal. Thus, in addition for use in eutectic or binary bonding or the like (as described above and shown in FIGS. 4-12), the metallization layer 12 can be utilized in joining two components by brazing (and shown in FIGS. 13-15).

When bonding the structures of FIGS. 13 and 14 together, if desired the sintering or annealing process described above for treatment of the metallization layer 12 may be omitted. In particular, the relatively high temperatures encountered during the brazing process can cause reactions similar to the chemical reactions in the annealing process.

Figure 15:
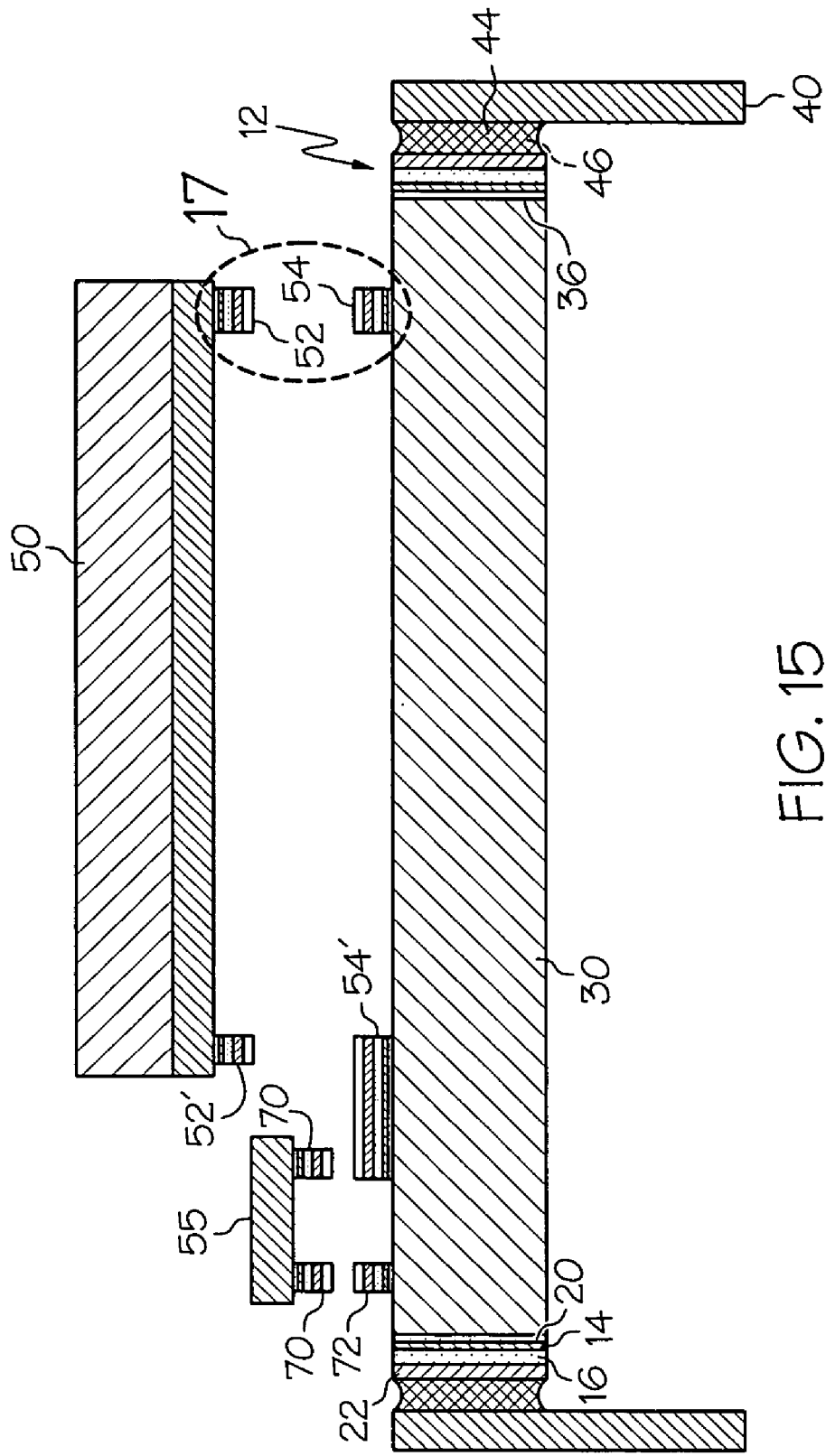
FIG. 15 is a side cross section of the wafer and housing of FIG. 14 with a control wafer and electronic component located adjacent thereto.

For illustrative purposes and to more easily show subsequent bonding steps, FIG. 15 illustrates the structure of FIG. 14 inverted from that shown in FIG. 14. Another component, substrate or control wafer 50 (which can be made of silicon or various other materials listed above for the substrate 10) is shown located above the disk 30. The wafer 50 includes a pair of bonding contacts 52, 52' located thereon, and the disk 30 includes a pair of bonding contacts 54, 54' located thereon. The bonding contacts 54, 54' of the disk 30 are sized and shaped to correspond to the bonding contacts 52, 52' of the wafer 50. In particular, the bonding contacts 52, 52', 54, 54' are arranged such that when the wafer 50 is aligned with and located on top of the disk 30, the bonding contacts 52, 52', 54, 54' engage each other in the manner of the well known standard flip chip bonding process.

As shown in FIG. 17, each of the bonding contacts 52, 54, (as well as bonding contacts 52', 54') include the metallization layer 12 and bonding agent 24 as disclosed, for example, in FIG. 3 and as described in the accompanying text. For ease of illustration each of the bonding layers 24, 24' are shown as a single layer and the various sub-layers are not shown. In the embodiment shown in FIGS. 15-18 and as contrasted with FIG. 3, rather than covering the entire surface of the associated substrate 30, 50, the metallization layers 12 and 12' and bonding layers 24 and 24' are patterned and cover only part of the underlying substrate 30, 50. The bonding contacts 52, 52', 54, 54' are formed in the desired shape by sputtering through a mask, or by removing the undesired portions of the metallization layer 12 and/or bonding materials 24 by, for example, reactive ion etching or other subtractive etching methods.

Figure 16:
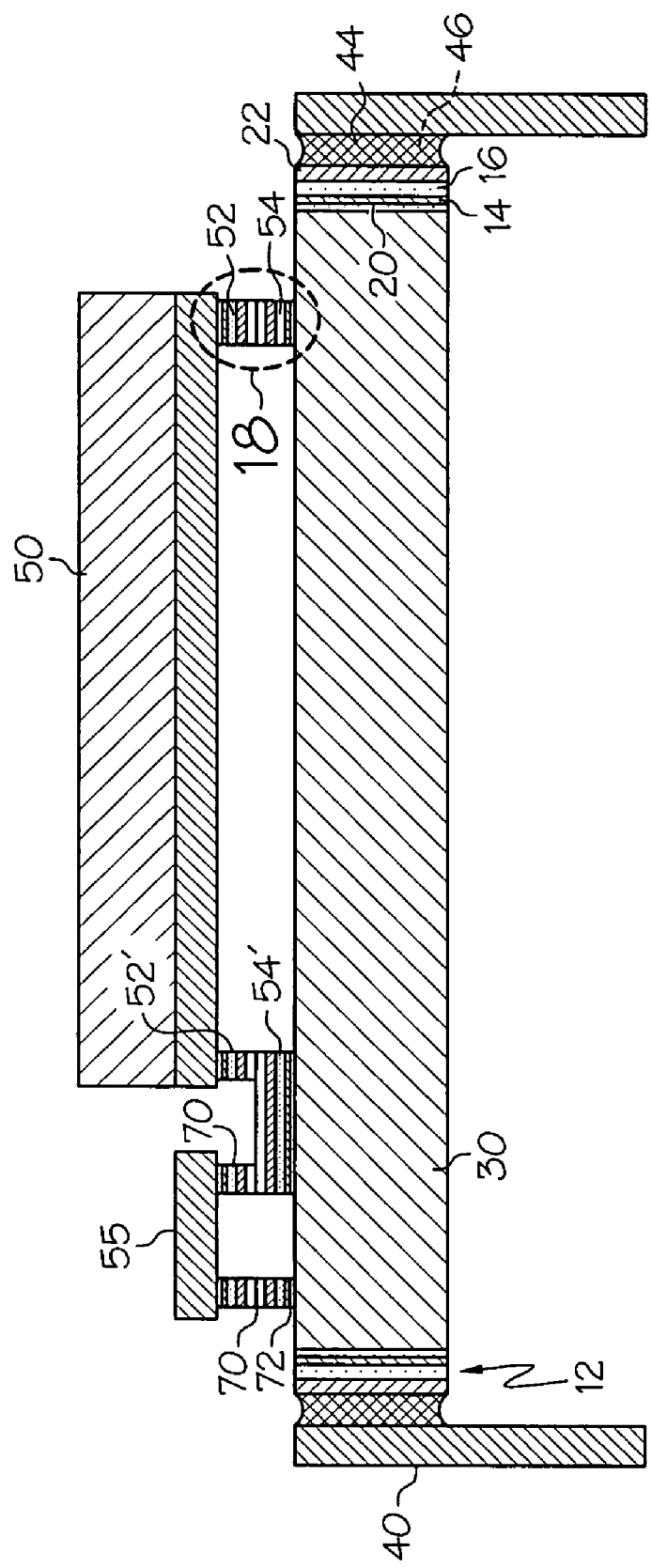
FIG. 16 is a side cross section of the wafer and housing joined to the control wafer and electronic component of FIG. 15.

After the bonding contacts 52, 52', 54, 54' are formed, the wafer 50 is located on top of the disk 30 so that the bonding contacts 52, 54 engage each other (FIG. 16). The resulting assembly is then heated to activate the contacting bonding layers 24, 24' and thereby couple the wafer 50 and the disk 30. This heating step is carried out to activate the bonding layers 24, 24' of the bonding contacts 52, 52', 54, 54' in the same manner discussed below in the context of FIGS. 4-12 describing the coupling of the bonding layers 24, 24' of those figures.

Each layer 14, 16, 22 of the metallization layers 12 is preferably made of an electrically conductive material. For example, as outlined above the metallization layer 12 may include tantalum, tantalum silicide, platinum and platinum silicide, all of which are electrically conductive. In addition, the bonding layers 24, 24' can be made of metals or other electrically conductive materials (i.e. gold and germanium). In this manner, the bonding contacts 52, 52', 54, 54' also serve to electrically couple the disk 30 and wafer 50. In particular, various electrical bond pads, output pads, metallic contacts and the like of the disk 30 and wafer 50 can be electrically coupled together by the bonding contacts. In this manner, the bonding contacts 52, 52', 54, 54' can serve the dual function of bonding the two components 30, 50 together as well as providing electrical contacts therebetween.

FIG. 15 illustrates an ASIC, transducer, circuitry, electronic component or the like (together termed an electronic component 55) to be coupled to the disk 30. The electronic component 55 has contacts 70 located thereon that are aligned with contact 54' and contact 72 of the disk 30. In this case, the electronic component 55 can be electrically coupled to the disk 30 and/or wafer 50 via contact 54', contact 70 and contact 52', as shown in FIG. 16.

If desired either contact 54, 54' may be located on or electrically coupled to a pin (not shown) embedded in the disk 30. The pin may be electrically coupled to an external device such as a processor (not shown) to thereby electrically couple the electronic component 55 to the external device. The lead 54' thus provides a robust and high heat resistant electrical contact.

In one example, double side polished 100 mm diameter single-crystal silicon wafer having a thickness of about 400 microns is provided. The wafer is then cleaned using the well known RCA1 cleaning process which removes organic films and residue from the wafer using water, hydrogen peroxide and ammonium hydroxide. The silicon wafer is then exposed to HF vapors for one minute to further clean the wafer.

The cleaned silicon wafer is then directly inserted into a sputter deposition system, such as a Model 944 Sputter System sold by KDF Electronic Vacuum Services Inc. of Valley Cottage, N.Y., or a CMS-18 Sputter System sold by Kurt J. Lesker Co. of Clairton, Pa. The sputter chamber is then depressurized to a pressure of between about 5 and about 15 millitorr. The wafer is then sputter etched at a power of about 100 Watts for 5 minutes to remove any residual oxides. A tantalum adhesion layer is then deposited to a thickness of about 500 Angstroms. Next, a tantalum silicide outward diffusion blocking layer is deposited to a thickness of about 2,000 Angstroms. A platinum inward diffusion blocking layer is then deposited to a thickness of about 1,500 Angstroms.

The silicon wafer with tantalum, tantalum silicide and platinum is then removed from the sputter deposition system and placed in an oven for annealing. The wafer is then annealed at 450° C. for 1 hour, and then annealed at 600° C. for 1 hour, with both annealing steps taking place at a pressure of 10-5 Torr. The annealed wafer is then re-inserted into the sputter system and exposed to a sputter etch at a power 100 Watts for 5 minutes. A tantalum adhesion layer is deposited to a thickness of 500 Angstroms, after which the bonding materials are deposited thereon. The silicon wafer can then be bonded to another component by transient liquid phase bonding techniques.

Having described the invention in detail and by reference to the preferred embodiments, it will be apparent that modifications and variations thereof are possible without departing from the scope of the invention.

What is claimed is:

1. A component comprising:
   a substrate selected from the group consisting of semiconductor materials, ceramics, glasses, nonmetallic materials, and combinations of these materials; and
   an annealed metallization layer including:
   an adhesion layer selected from the group consisting of compounds that are the reaction product of the substrate and a metal selected from the group consisting of tantalum, chromium, zirconium, and hafnium;
a first diffusion blocking layer of a compound selected from the group consisting of tantalum silicide, tantalum carbide and tungsten nitride; and
a second diffusion blocking layer of platinum silicide.

2. The component of claim 1 wherein:
the metallization layer includes a tantalum layer located on the substrate, a tantalum silicide first diffusion blocking layer located on the tantalum layer, and a platinum silicide second diffusion blocking layer located on the tantalum silicide layer.

3. The component of claim 2 wherein each of the tantalum, tantalum silicide and platinum silicide layers have a thickness of between about 100 Angstroms and about 10,000 Angstroms.

4. The component of claim 2 wherein the component additionally includes a bonding agent located on the platinum silicide layer, the bonding agent being a brazing alloy, a eutectic alloy, or a binary alloy.

5. The component of claim 2 wherein said substrate is silicon and the reaction product of the substrate and the tantalum layer is a second tantalum silicide layer.

6. The component of claim 5 wherein the second tantalum silicide layer is located between the tantalum layer and the substrate.

7. The component of claim 1 wherein the substrate is a silicon or a ceramic material.

8. The component of claim 1 wherein the substrate is silicon.

9. The component of claim 1 wherein an auxiliary component is bonded to the substrate by a bonding agent located between the substrate and the auxiliary component, the bonding agent being coupled to the metallization layer to thereby join the substrate and the auxiliary component.

10. The component of claim 9 wherein the substrate is a wafer or part of a wafer and the auxiliary component is a housing for the wafer or part of the wafer.

11. The component of claim 10 wherein the wafer or part of the wafer is generally cylindrical and the housing is generally tubular and receives the wafer or part of the wafer therein.

12. The component of claim 11 wherein the wafer or part of the wafer is radially compressed by the housing.

13. The component of claim 11 wherein the wafer or part of the wafer has a circumferential surface and the metallization layer is located on the circumferential surface of the wafer or part of the wafer.

14. The component of claim 9 wherein the substrate is a ceramic and the auxiliary component is metal.

15. The component of claim 9 wherein the substrate and the auxiliary component are both silicon wafers or parts of silicon wafers.

16. The component of claim 15 wherein the auxiliary component includes an auxiliary substrate and an auxiliary component metallization layer including a tantalum layer located on the auxiliary substrate, a tantalum silicide layer located on the tantalum layer, and a platinum silicide layer located on the tantalum silicide layer.

17. The component of claim 16 wherein the bonding agent is located between and coupled to the metallization layer of the substrate and the metallization layer of the auxiliary component.

18. The component of claim 17 wherein the metallization layer selectively covers the substrate and the auxiliary metallization layer selectively covers the auxiliary substrate, and wherein the metallization layer and the auxiliary metallization layer are arranged in complementary shapes such that the metallization layer and the auxiliary component metallization layer are aligned with each other.

19. The component of claim 1 wherein said component is made of semiconductor materials, ceramics, glasses, nonmetallic materials, or combinations of these materials.

20. A metallized component including:
a substrate; and
a metallization layer on the substrate, the metallization layer having an adhesive strength to silicon of at least about 50 MPa after exposure to a temperature of about 600° C. for about 30 minutes as measured by a mechanical shear test, and wherein the metallization layer remains structurally intact after exposure to a temperature of about 600° C. for about 1000 hours, wherein the metallization layer includes a tantalum layer located on the substrate, a tantalum silicide layer located on the tantalum layer, and a platinum silicide layer located on the tantalum silicide layer.

21. The component of claim 20 wherein the metallization layer resists significant diffusion therethrough such that after exposing the metallized component to a temperature of about 600° C. for 50 hours, no new layers of any material form in the metallization layer due to diffusion which have mass greater than about 1% of the metallization layer as measured by x-ray photoelectron spectroscopy analysis.

22. The component of claim 20 wherein the substrate is silicon and the metallization layer further includes a second tantalum silicide layer located between the tantalum layer and the substrate.

23. The component of claim 20 wherein the substrate is a semiconductor material or a ceramic material.

24. The component of claim 20 wherein the metallization layer is electrically coupled to an electronic structure located on or supported by the substrate.

25. The component of claim 20 further including an auxiliary component and a bonding agent located between the component and the auxiliary component, the bonding agent being coupled to the metallization layer to thereby join the component and the auxiliary component.

26. The component of claim 25 wherein the bonding agent is a brazing alloy, or a eutectic alloy, or a binary alloy.

27. A system comprising:
metallized component including:
a substrate; and
a metallization layer on the substrate, the metallization layer having an adhesive strength to silicon of at least about 50 MPa after exposure to a temperature of about 600° C. for about 30 minutes as measured by a mechanical shear test, and wherein the metallization layer remains structurally intact after exposure to a temperature of about 600° C. for about 1000 hours;
an auxiliary component, and
a bonding agent located between the component and the auxiliary component, the bonding agent being coupled to the metallization layer to thereby join the component and the auxiliary component wherein the auxiliary component includes an auxiliary component metallization layer having an adhesive strength to silicon of at least about 50 MPa as measured by a mechanical shear test after exposure to a temperature of about 600° C. for about 30 minutes, and wherein the auxiliary component metallization layer remains structurally intact after exposure to a temperature of about 600° C. for 1000 hours.

28. The component of claim 27 wherein the auxiliary component metallization layer includes a tantalum layer located on the auxiliary component, a tantalum silicide layer located on the tantalum layer, and a platinum silicide layer located on the tantalum silicide layer.

29. The component of claim 27 wherein the bonding agent is located between and coupled to the metallization layer of the component and the metallization layer of the auxiliary component.

30. A method for forming a system comprising the steps of:
providing a substrate;
applying a metallization layer on the substrate, the metallization layer including a tantalum layer on the substrate, a tantalum silicide layer on the tantalum layer, and a platinum layer on the tantalum silicide layer.

31. The method of claim 30 further including the step of annealing the metallization layer.

32. The method of claim 31 wherein the substrate is silicon and the annealing step causes the creation of a tantalum silicide outward diffusion blocking layer located between the tantalum layer and the substrate.

33. The method of claim 31 wherein the annealing step converts the platinum layer to platinum silicide.

34. The method of claim 31 wherein the annealing step includes exposing the metallization layer to a temperature of at least about 460° C.

35. The method of claim 30 wherein the applying step includes depositing the tantalum layer, the tantalum silicide layer and the platinum layer by plasma enhanced physical vapor deposition.

36. The method of claim 30 wherein the applying step includes depositing the tantalum silicide layer on the substrate by depositing alternating layers of tantalum and silicon and then annealing the alternating layers.

37. The method of claim 30 further comprising the step of, prior to the applying step, cleaning the substrate to remove oxides therefrom.

38. The method of claim 30 wherein each of the tantalum, tantalum silicide and platinum layers have thicknesses between about 100 Angstroms and about 10,000 Angstroms.

39. The method of claim 30 further including the steps of providing an auxiliary component, applying a bonding agent between the substrate and the auxiliary component or positioning the substrate and the auxiliary component such that the bonding agent is located therebetween.

40. The method of claim 39 wherein the auxiliary component includes an auxiliary metallization layer and wherein the metallization layer selectively covers the substrate and the auxiliary metallization layer selectively covers the auxiliary component, and wherein the metallization layer and the auxiliary metallization layer are arranged in complementary shapes such that the metallization layers are generally aligned when the substrate and the auxiliary component are aligned with each other in the manner of a flip chip bonding process.

41. A metallization or bonding layer for use on a substrate including:
an adhesion layer selected from the group consisting of compounds that are the reaction product of the substrate and a metal selected from the group consisting of tantalum, chromium, zirconium, and hafnium;
a first diffusion blocking layer of a compound selected from the group consisting of tantalum silicide, tantalum carbide and tungsten nitride; and
a second diffusion blocking layer of platinum silicide.

42. The layer of claim 41 wherein the metallization or bonding layer includes a tantalum layer located on the substrate, a tantalum silicide layer located on the tantalum layer, and a platinum silicide layer located on the tantalum silicide layer.

43. A system comprising:
a component; and
a metallization layer on said component, said metallization layer including a tantalum layer located on said component, a tantalum silicide layer located on said tantalum layer, and a platinum layer located on said tantalum silicide layer.

44. The system of claim 43 wherein each of said tantalum, tantalum silicide and platinum layers have a thickness between about 100 Angstroms and about 10,000 Angstroms.

45. A system comprising:
a component;
a metallization layer on said component, said metallization layer including a tantalum layer located on said component, a tantalum silicide layer located on said tantalum layer, and a platinum silicide layer located on said tantalum silicide layer; and
a bonding structure located on said metallization layer, said bonding structure including a hypoeutectic gold-germanium solid solution alloy, a hypoeutectic gold-silicon solid solution alloy, or a hypoeutectic gold-tin solid solution alloy.

46. The system of claim 45 further comprising an auxiliary component coupled to said component via said bonding structure.

47. The system of claim 46 wherein said auxiliary component incudes an auxiliary metallization layer located thereon, said auxiliary metallization layer including a tantalum layer located on said auxiliary component, a tantalum silicide layer located on said tantalum layer, and a platinum silicide layer located on said tantalum silicide layer.

48. A method for bonding two components together comprising the steps of:
providing a first component having a metallization layer located thereon, said metallization layer including a tantalum layer located on said component, a tantalum silicide layer located on said tantalum layer, and a platinum silicide layer located on said tantalum silicide layer;
providing a second component having a metallization layer located thereon, said metallization layer of said second component including a tantalum layer located on said second component, a tantalum silicide layer located on said tantalum layer, and a platinum silicide layer located on said tantalum silicide layer;
locating a first eutectic bonding material between said first and second component, said first eutectic bonding material comprising at least one of germanium, tin, or silicon;
locating a second eutectic bonding material between said first and second component and adjacent to said first eutectic bonding material, said second eutectic bonding material comprising gold;
heating said first and second eutectic bonding materials to a temperature above a eutectic temperature of an alloy of said first and second eutectic bonding materials to allow a hypoeutectic alloy to form out of said first and second eutectic bonding materials; and
cooling said hypoeutectic alloy to form a solid solution alloy bonding said first and second components together.

* * * * *